United States Patent [19]

Arai et al.

[11] Patent Number: 4,643,915
[45] Date of Patent: Feb. 17, 1987

[54] PROCESS FOR PRODUCING MAGNETIC RECORDING MEDIUM

[75] Inventors: Yoshihiro Arai; Ryuji Shirahata, both of Kanagawa, Japan

[73] Assignee: Fuji Photo Film Co., Ltd., Kanagawa, Japan

[21] Appl. No.: 749,252

[22] Filed: Jun. 27, 1985

[30] Foreign Application Priority Data

Jun. 28, 1984 [JP] Japan .................... 59-133613

[51] Int. Cl.⁴ .............................. B05D 5/12
[52] U.S. Cl. .......................... 427/130; 427/131; 427/132; 427/296
[58] Field of Search ............... 427/132, 131, 130, 296

[56] References Cited

U.S. PATENT DOCUMENTS 4,477,489 10/1984 Yanai et al. ................ 427/132

FOREIGN PATENT DOCUMENTS 0140998 11/1979 Japan .

Primary Examiner—Bernard D. Pianalto
Attorney, Agent, or Firm—Sughrue, Mion, Zinn, Macpeak, and Seas

[57] ABSTRACT

A magnetic recording medium provided with a protective layer having excellent corrosion resistance and good adhesion is provided by a process which comprises forming a thin magnetic metal film on a nonmagnetic substrate by an oblique vapor deposition technique in a vacuum vessel, blowing an oxidizing gas against the surface of the thin magnetic metal film in the same vacuum vessel as used in the formation of the thin magnetic metal film, and thereafter forming a thin nonmagnetic metal film on the thin magnetic metal film.

6 Claims, 2 Drawing Figures

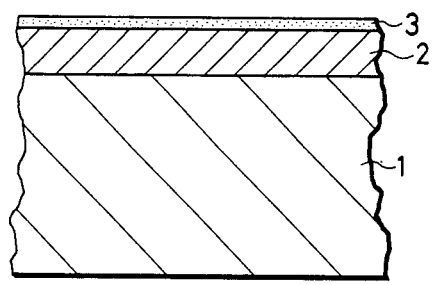
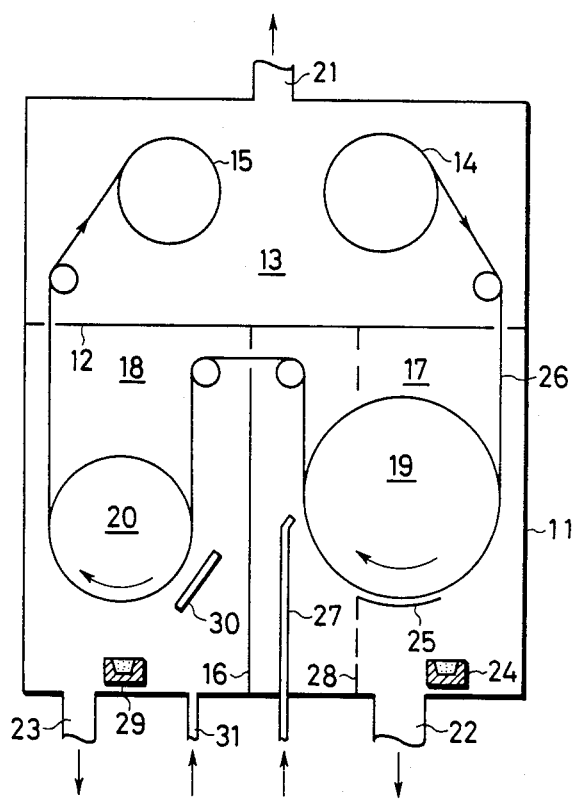

PROCESS FOR PRODUCING MAGNETIC RECORDING MEDIUM

FIELD OF THE INVENTION

This invention relates to a process for producing a magnetic recording medium having a thin magnetic metal film formed by an oblique vapor deposition technique, and particularly to a process for producing a thin metal film-type magnetic recording medium provided with a protective layer having excellent corrosion resistance and good adhesion.

BACKGROUND OF THE INVENTION

Heretofore, magnetic recording media of the coated type have been used widely. These recording media are obtained by coating a powdery magnetic material, for example, a magnetic powder such as gamma-$Fe_2O_3$, Co-doped gamma-$Fe_2O_3$, $Fe_3O_4$, Co-doped $Fe_3O_4$, a Berthollide compound of gamma-$Fe_2O_3$ and $Fe_3O_4$ or $CrO_2$ or a ferromagnetic alloy powder, dispersed in an organic binder such as a vinyl chloride/vinyl acetate copolymer, a styrene/butadiene copolymer, an epoxy resin or a polyurethane resin, on a non-magnetic support and drying the coating. In recent years, with an increased demand for high-density recording, much interest has been aroused in "binderless" magnetic recording media having a thin ferromagnetic metal film formed by vapor deposition techniques such as vapor deposition, sputtering or ion plating, or plating techniques such as electroplating or electroless plating as a magnetic recording layer, and various efforts have been made toward the commercial acceptance of such binderless magnetic recording media.

In the conventional coated magnetic recording media, metal oxides having a saturation magnetization lower than that of ferromagnetic metals are used as a magnetic substance. Hence, thickness reduction required for high-density recording decreases signal outputs, and there is a limit to thickness reduction. Furthermore, the production process is complex, and large accessory devices are required for solvent recovery or the prevention of environmental pollution. The binderless magnetic recording media have the advantage that they can be formed in ultrathin thicknesses for high-density recording because a ferromagnetic metal having a saturation magnetization higher than that of the above oxides can be formed into a thin film in the absence of a non-magnetic substance such as a binder. Moreover, the production process therefor is simple.

Higher coercivity and smaller thickness have been advocated both theoretically and experimentally as one condition for magnetic recording media for high-density recording, and much is expected of the binderless magnetic recording media whose thickness can be easily reduced by one order of magnitude from that of coated type magnetic recording media and which has high saturation flux density.

The vapor deposition technique, in particular, has the great advantage that it does not require a waste liquor treatment as in plating; the production process is simple; and the speed of film deposition can be made high. The oblique vapor deposition method described in, for example U.S. Pat. Nos. 3,342,632 and 3,342,633 is known as a method for producing a magnetic film having a coercive force and a squareness ratio desirable for magnetic recording media by vapor deposition.

Resistance against corrosion and abrasion and running stability are further significant problems with magnetic recording media composed of ferromagnetic metal films. The magnetic recording media are placed in high-speed relative motion with respect to a magnetic head during recording, playback and erasing of magnetic signals. At this time, the magnetic recording media must run smoothly and stably, and should not undergo wear or fracture by contact with the head. The medium is also required to be free from reduction or disappearance of recorded signals by corrosive changes, etc. during storage. The provision of a protective layer has been studied as a means for increasing the durability and weatherability of the magnetic recording media.

Protective layers so far proposed in the art include, for example, those composed of a thin film of an alloy such as an Ni-W alloy (Japanese Patent Application (OPI) No. 43110/1976), an Ni-B alloy (Japanese Patent Application (OPI) No. 2405/1977), an Ni alloy heat-treated to impart higher hardness (Japanese Patent Application (OPI) No. 102605/1976) and an Ni-Cr alloy (Japanese Patent Application (OPI) No. 73108/1978), those composed of an oxide or carbide (Japanese Patent Application (OPI) No. 104602/1975), an oxide magnetic substance provided thereon an alpha-$Fe_2O_3$-type thin film as a protective layer (Japanese Patent Application (OPI) No. 59606/1976), an Si-Si oxide (Japanese Patent Application (OPI) No. 127203/1977), an Si-Si oxide placed on a magnetic layer with Cr therebetween (Japanese Patent Application (OPI) No. 127204/1977), a silicon nitride compound (Japanese Patent Application (OPI) No. 73931/1980), or an La boride layer (Japanese Patent Application (OPI) No. 11626/1981), those composed of an organic material such as a monomolecular layer of a saturated fatty acid (U.S. Pat. No. 4,087,582), and a lubricating liquid layer containing an antioxidant (Japanese Patent Application (OPI) No. 20805/1976). (The term "OPI" as used herein means a "published unexamined Japanese Patent application".)

It is known that the provision of a protective layer composed of a film of a nonmagnetic metal such as Cr, Ti, Sn, Al, Cu, Zr or Ta, by using a sputtering method (*Kinzoku Hyomen Gijutsu* (Metal Surface Technology), 36(6), 62ff. (1983)), an ion plating method (U.S. patent application Ser. No. 596,789 filed on Apr. 4, 1984), etc., increased weatherability. Such a protective layer, however, does not have sufficient durability, and still requires improvement for commercial acceptance.

SUMMARY OF THE INVENTION

An object of this invention is to provide a thin metal film-type magnetic recording medium having excellent weatherability and durability.

According to this invention, there is provided a process for producing a magnetic recording medium, which comprises forming a thin magnetic metal film on a nonmagnetic substrate by an oblique vapor deposition technique in a vacuum vessel, blowing an oxidizing gas against the surface of the thin magnetic metal film in the same vacuum vessel as used in the formation of the thin magnetic metal film, and thereafter forming a thin nonmagnetic metal film on the thin magnetic metal film.

In one preferred embodiment, the thin magnetic metal film is a thin film of a nonmagnetic metal selected from the group consisting of Cr, Ti, Sn, Cu, Al, Zr and Ta.

BRIEF DESCRIPTION OF THE ACCOMPANYING DRAWINGS

FIG. 1 shows the structure of a magnetic recording medium produced by the present invention; and FIG. 2 is a view showing one example of a windup-type vapor deposition device which can be used in the production of a magnetic recording medium by the process of this invention.

DETAILED DESCRIPTION OF THE INVENTION

In the present invention, the term "oblique vapor deposition technique" refers to a method whereby vapor stream of a magnetic metal material is directed onto the surface of a substrate at a certain angle to the normal to the substrate surface, and thin film of the magnetic metal is deposited on the substrate surface. This technique is disclosed in, for example, U.S. Pat. Nos. 3,342,632 and 3,342,633. The angle of incidence may be changed as the thin magnetic metal film grows. Particularly, when a thin magnetic metal film is to be formed on a tape-like substrate, a method is used which involves continuously changing the angle of incidence of the vapor stream as the substrate moves as described in, e.g., Japanese Patent Application (OPI) Nos. 95604/1978 and 87706/1978.

In the process of this invention, an oxidizing gas is blown against the surface of the thin magnetic metal film so formed in the same vacuum vessel as that used to deposit the thin magnetic metal film. Thereafter, a thin film of a nonmagnetic metal is formed on the treated surface of the thin magnetic metal film.

Examples of the oxidizing gas used herein include oxygen gas, a mixture of oxygen gas and argon gas, and a mixture of oxygen gas and nitrogen gas, preferably oxygen gas. The amount of the oxidizing gas used herein is in the range from 500 to 3,000 cc/min, preferably from 600 to 1500 cc/min.

The magnetic recording medium produced by this invention is shown in FIG. 1. The thin magnetic metal film 2 is formed by oblique vacuum deposition on the nonmagnetic substrate 1, and the thin nonmagnetic metal film 3 is formed on top of the film 2. The thin magnetic metal film 2 should have a thickness which is large enough to produce a sufficient output for the magnetic recording medium and small enough to permit high density recording. Hence, its thickness is generally between about 0.02 micrometer to 5.0 micrometers, preferably from about 0.05 micrometer to 2.0 micrometers. On the other hand, the thin nonmagnetic metal film 3 has a thickness of about 0.005 micrometer to 0.1 micrometer, preferably about 0.005 micrometer to 0.02 micrometer, in order to secure a sufficient protective action and prevent reduction in output owing to spacing losses between the surface of the thin magnetic metal film and a magnetic head for recording and playback.

Examples of the magnetic metal material that can be used in this invention include metals such as Fe, Co, and Ni, and ferromagnetic alloys such as Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr, Ni-Co-Cr and Fe-Co-Ni-Cr. Co and alloys containing at least 70% by weight of Co are preferred. The deposition of the thin magnetic metal film may be effected in an atmosphere containing a reactive gas such as oxygen. The nonmagnetic metal material may, for example, be at least one material selected from the group consisting of Cr, Ti, Sn, Cu, Al, Zr and Ta, preferably at least one material selected from the group consisting of Cr, Ti and Sn. The nonmagnetic metal film may be formed by physical vapor deposition techniques (PVD) such as vapor deposition as described in, e.g., U.S. Pat. No. 2,664,853, ion plating as described in, e.g., U.S. patent application Ser. No. 596,789 filed on Apr. 4, 1984 or sputtering as described in, e.g., *Kinzoku Hyomen Gijutsu* (Metal Surface Technology) 36(6), 62ff. (1983).

The substrate is preferably a plastic base such as polyethylene terephthalate, polyimides, polyamides, polyvinyl chloride, cellulose triacetate, polycarbonates or polyethylene naphthalate.

FIG. 2 shows one example of a windup-type vapor deposition device used for the production of the magnetic recording medium in accordance with this invention. A vacuum vessel 11 includes an upper chamber 13 isolated from the rest by a partitioning wall 12. In the upper chamber 13, a delivery roll 14 and a take-up roll 15 for a tape-like substrate are disposed. The lower portion of the vacuum vessel 11 is partitioned into two chambers 17 and 18 by a partitioning wall 16, and cooling cans 19 and 20 are disposed respectively in the chambers 17 and 18. The chambers 13, 17 and 18 are adapted to be evacuated independently through exhaust openings 21, 22 and 23. An evaporation source 24 for evaporating the magnetic metal material is set below the cooling can 19, and a vapor beam from the evaporation source 24 is adapted to deposit obliquely onto the substrate 26 moving along the surface of the can 19 through a mask 25. The substrate 26 having the thin magnetic metal film deposited thereon further moves along the surface of the can 19, the oxygen is blown against the surface of the thin magnetic metal film from a nozzle 27. The amount of oxygen to be blown is determined depending upon the evacuating ability of the vacuum device, the size and position of the nozzle, the width of the substrate, the speed of conveying the substrate, etc. A partitioning wall 28 may be provided to remove any effect of oxygen from the nozzle 27 on the vapor deposition of the thin magnetic metal film. Thereafter, the substrate 26 is transferred to the chamber 18 where a thin nonmagnetic metal film is formed on the substance.

The thin monmagnetic metal film is formed by vapor deposition from an evaporation source 29 positioned below the can 20, or by sputtering from a target 30. A gas required during sputtering, Ar for example, can be introduced from an introduction portion 31. The substrate 26 having the thin nonmagnetic metal film formed thereon is wound up by the take-up roll 15.

By the above procedure, a magnetic recording medium having a structrue shown in FIG. 1 is obtained. If desired, a lubricant layer may be provided on the surface of the thin nonmagnetic metal film as described in, e.g., U.S. Pat. No. 4,087,582, and a backing layer on the back of the substrate as described in, e.g., Japanese Patent Application (OPI) No. 188326/1983. A layer composed of an organic or inorganic material may also be formed between the substrate and the thin magnetic metal film as described in, e.g., U.S. Pat. No. 4,226,681.

The following Examples illustrate the present invention more specifically with reference to FIG. 2. These examples are not meant to limit the present invention in any way. Unless otherwise specified, all percents, ratios, etc. are by weight.

EXAMPLE 1

A thin small metal film-type magnetic tape was produced using the windup-type vapor deposition device shown in FIG. 2. A polyethylene terephthalate film having a width of 300 mm and a thickness of 12.5 micrometers was used as the substrate 26, and the speed of conveying it was adjusted to 20 m/min. Co was charged into the evaporation source 24, and a thin magnetic Co film having a thickness of 1200 Å was formed on the substrate 26 by oblique vapor deposition. Oxygen gas was then blown against the surface of the thin magnetic Co film at a rate of 1200 cc/min. from the nozzle 27. Then, Cr, Sn or Al was vapor-deposited from the evaporation source 29 onto the treated surface of the thin magnetic metal film to a thickness of 120 Å. The degree of vacuum was adjusted to $3.0 \times 10^{-5}$ torr during the vapor deposition of the magnetic Co metal and during the vapor deposition of the nonmagnetic metal (Cr, Sn or Al).

COMPARATIVE EXAMPLE 1

In the same way as in Example 1, a thin magnetic Co film was formed on a polyethylene terephthalate film by vapor deposition of Co, and then without blowing oxygen gas against the resulting thin film, Cr, Sn or Al was vapor-deposited on the thin magnetic metal film in the same way as in Example 1. Alternatively, oxygen gas was blown against the surface of the thin magnetic metal film in the same way as in Example 1, but a thin film of the monmagnetic metal (Cr, Sn or Al) was not formed.

The weatherabilities and durabilities of the magnetic tapes obtained in Example 1 and Comparative Example 1 were measured.

Weatherability was determined by subjecting each sample to an exposure-type weather tester (Model E-12WG, manufactured by Yamazaki Seiki Kenkyusho) for 24 hours, then examining the state of occurrence of rust, and evaluating it on a 5-grade evaluation as shown below:

FIVE GRADE EVALUATION OF WEATHERBILITY

1. Rust is observed remarkably with naked eye.
2. Rust is observed with naked eye.
3. Rust is hardly observed with naked eye.
4. Rust is observed with a microscope ($\times 50$).
5. Rust is not observed with a microscope ($\times 50$).

Durability was evaluated by the scratch strength of the thin film. A saphhire stylus having a tip radius of curvature of 5 micrometers was pressed perpendicularly against the surface of the film and moved under a load. The strength of the film was determined by the amount of the load under which the film was injured by scratching.

The results are shown in Table 1.

TABLE 1

| Sample | Blowing of $O_2$ | Thin Nonmagnetic Film | Weatherability | Scratch Strength (g) |
|---|---|---|---|---|
| Example 1 | Yes | Cr | 5 | 45 |
|  | Yes | Sn | 4 | 41 |
|  | Yes | Al | 3 | 40 |
| Comparative Example 1 | No | Cr | 4 | 31 |
|  | No | Sn | 2 | 32 |
|  | No | Al | 2 | 29 |

TABLE 1-continued

| Sample | Blowing of $O_2$ | Thin Nonmagnetic Film | Weatherability | Scratch Strength (g) |
|---|---|---|---|---|
|  | No | None | 1 | 25 |

EXAMPLE 2

By using the windup-type vapor deposition device shown in FIG. 2, a thin film of magnetic CoNi (20% by weight of Ni) was formed to a thickness of 1500 Å on a polyethylene terephthalate film having a thickness of 9.5 micrometers by olique vapor deposition. Then, oxygen gas was blown against the surface of the thin magnetic metal film at a rate of 1000 cc/min. from the nozzle 27. Then, Ti, Cu, Zr or Ta was deposited from the target 30 to a thickness of 150 Å by sputtering. During the vapor deposition of the magnetic CoNi, the degree of vacuum was adjusted to $1.0 \times 10^{-4}$ torr by introducing oxygen gas into a site near the CoNi vapor stream. At the time of sputtering the nonmagnetic metal (Ti, Cu, Zr, Ta), the degree of vacuum was adjusted to 0.01 torr by introducing argon gas.

COMPARATIVE EXAMPLE 2

In the same way as in Example 2, a thin magnetic CoNi film was formed on a polyethylene terephthalate film. Thereafter, without blowing oxygen gas onto the resulting thin film, Cu, Zr or Ta was deposited on the film by sputtering in the same way as in Example 2. Alternatively, after the deposition of CoNi, oxygen gas was blown against the surface of the CoNi film in the same way as in Example 2 without forming a nonmagnetic metal film (Ti, Cu, Zr, Ta).

The weatherabilities and durabilities of the magnetic tapes obtained in Example 2 and Comparative Example 2 were measured by the same methods as in Example 1 and Comparative Example 1. The results are shown in Table 2.

TABLE 2

| Sample | Blowing of $O_2$ | Thin Nonmagnetic Film | Weatherability | Scratch Strength (g) |
|---|---|---|---|---|
| Example 2 | Yes | Ti | 4 | 42 |
|  | Yes | Cu | 4 | 43 |
|  | Yes | Zr | 4 | 40 |
|  | Yes | Ta | 3 | 42 |
| Comparative Example 2 | No | Ti | 2 | 30 |
|  | No | Cu | 3 | 28 |
|  | No | Zr | 2 | 31 |
|  | NO | Ta | 2 | 32 |
|  | No | None | 1 | 25 |

While the invention has been described in detail and with reference to specific embodiments thereof, it will be apparent to one skilled in the art that various changes and modifications can be made therein without departing from the spirit and scope thereof.

What is claimed is:

1. A process for producing a magnetic recording medium, which comprises forming a thin magnetic metal film on a nonmagnetic substrate by an oblique vapor deposition technique in a vacuum vessel, blowing an oxidizing gas against the surface of the thin magnetic metal film in the same vacuum vessel as used in the formation of the thin magnetic metal film, and thereafter forming as thin nonmagnetic metal film having a thickness of about 0.005 micrometer to 0.1 micrometer on the thin magnetic metal film.

2. The process of claim 1, wherein the thin nonmagnetic metal film is of at least one nonmagnetic metal selected from the group consisting of Cr, Ti, Sn, Cu, Al, and Ta.

3. The process of claim 2, wherein the thin nonmagnetic metal film is of at least one nonmagnetic metal selected from the group consisting of Cr, Ti and Sn.

4. The process of claim 1, wherein the thin magnetic film has a thickness of about 0.02 micrometer to 5.0 micrometers.

5. The process of claim 1, wherein the thin magnetic film has a thickness of about 0.05 micrometer to 2.0 micrometers.

6. The process of claim 5, wherein the thin nonmagnetic metal film has a thickness of about 0.005 micrometer to 0.02 micrometer.

* * * * *